(12) United States Patent
Ji et al.

(10) Patent No.: US 8,120,937 B2
(45) Date of Patent: Feb. 21, 2012

(54) TERNARY CONTENT ADDRESSABLE MEMORY USING PHASE CHANGE DEVICES

(75) Inventors: Brian L. Ji, Fishkill, NY (US); Chung H. Lam, Peekskill, NY (US); Robert K. Montoye, Rocheter, MN (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 12/399,346

(22) Filed: Mar. 6, 2009

(65) Prior Publication Data

US 2010/0226161 A1    Sep. 9, 2010

(51) Int. Cl.
*G11C 10/00* (2006.01)
*G11C 11/00* (2006.01)
*G11C 11/56* (2006.01)

(52) U.S. Cl. ............. 365/49.17; 365/49.1; 365/148; 365/168

(58) Field of Classification Search .............. None
See application file for complete search history.

(56) References Cited

U.S. PATENT DOCUMENTS

| | | | | |
|---|---|---|---|---|
| 3,544,977 A | 12/1970 | Bohner | | 365/49.1 |
| 3,575,617 A | 4/1971 | Burns | | 327/210 |
| 4,799,192 A | 1/1989 | Wade et al. | | 365/49.1 |
| 5,319,590 A | 6/1994 | Montoye | | 365/49.17 |
| 6,317,349 B1 * | 11/2001 | Wong | | 365/49.15 |
| 7,031,177 B2 * | 4/2006 | de Sandre | | 365/49.15 |
| 7,050,316 B1 | 5/2006 | Lin et al. | | 365/49.15 |
| 7,227,765 B2 | 6/2007 | De Sandre et al. | | 365/49.15 |
| 7,319,608 B2 * | 1/2008 | Hsu et al. | | 365/163 |
| 7,782,646 B2 * | 8/2010 | Lam et al. | | 365/49.17 |
| 2004/0218593 A1 * | 11/2004 | Hammons et al. | | 370/386 |
| 2006/0067097 A1 * | 3/2006 | Lien et al. | | 365/49 |
| 2007/0097740 A1 | 5/2007 | Derhacobian et al. | | 365/163 |
| 2007/0247196 A1 * | 10/2007 | Niedermeier et al. | | 326/95 |

OTHER PUBLICATIONS

Miwa et al. ("A 1-Mb 2-Tr/b Nonvolatile CAM Based on Flash Memory Technology", IEEE Journal, vol. 31, No. 11, Nov. 1996).*

* cited by examiner

*Primary Examiner* — Hoai V Ho
*Assistant Examiner* — James G Norman
(74) *Attorney, Agent, or Firm* — Ido Tuchman; Vazken Alexanian (57) ABSTRACT

A content addressable memory device with a plurality of memory cells storing ternary data values of high, low, and don't care. An aspect of the content addressable memory device is the use of first memory elements and second memory elements in the memory cells. The first and second memory elements are electrically coupled in parallel circuit to a match-line. The first memory elements are coupled to first word-lines and the second memory elements are coupled to second word-lines. The first memory elements are configured to store low resistance states if the ternary data value is low and high resistance states if the ternary data value is either high or don't care. The second memory elements are configured to store the low resistance states if the ternary data value is high and the high resistance states if the ternary data value is either low or don't care.

13 Claims, 6 Drawing Sheets

Fig. 2

| Data Bit Value: | First Memory Element State: | Second Memory Element State: |
|---|---|---|
| High | High Resistance | Low Resistance |
| Low | Low Resistance | High Resistance |
| Don't Care | High Resistance | High Resistance |

Fig. 3A

| Search Bit Value: | First Access Device State: | Second Access Device State: |
|---|---|---|
| High | Low Resistance | High Resistance |
| Low | High Resistance | Low Resistance |
| Don't Care | High Resistance | High Resistance |

TERNARY CONTENT ADDRESSABLE MEMORY USING PHASE CHANGE DEVICES

BACKGROUND OF THE INVENTION

1. Field of the Invention

The present invention relates to programming content addressable memory utilizing phase change memory and separate word-line and search-line access elements.

2. Description of Background

Content addressable memory (CAM) is a type of computer memory utilized in high speed searching applications. Most CAM devices utilize transistors configured as static random access memory (SRAM), and additional transistor circuits for match operations. Typically in these CAM devices search line access transistors and word line access transistors are necessary to operate and program individual memory cells in the memory arrays. The search line access transistors and word line access transistors are often comprised of power intensive large drive field effect transistors (FET).

Phase change material can also be utilized to store information in CAM devices. Phase change materials can be manipulated into different phases or states, with each phase representing a different data value. Generally, each phase exhibits different electrical properties. The amorphous and crystalline phases are typically two phases used for binary data storage (1's and 0's) since they have detectable differences in electrical resistance. Specifically, the amorphous phase has a higher resistance than the crystalline phase.

One difficulty in using resistive memory elements, such as phase change memory, in CAM designs is the size of an individual memory cell and the number of lines (search-lines, word-lines, bit-lines, match-lines, and their complements) that must be utilized. Thus, it is beneficial to devise a CAM device that requires fewer lines. Additionally, it would be also beneficial to devise a CAM device that can also store ternary data.

SUMMARY OF THE INVENTION

One aspect of the invention is a memory cell in a content addressable memory array for storing a ternary data value. The ternary data value is one of low, high, and don't care. The memory cell includes a first memory element configured to store a low resistance state if the ternary data value is low and a high resistance state if the ternary data value is either high or don't care. The high resistance state is at least one order of magnitude higher in resistance than the low resistance state. The memory cell includes a second memory element configured to store the low resistance state if the ternary data value is high and the high resistance state if the ternary data value is either low or don't care. The memory cell also includes a match-line electrically coupled to the first memory element and the second memory element in parallel circuit.

Another aspect of the invention is a content addressable memory device for storing data words. Each bit of a data word is set to one of three ternary data values of low, high, and don't care. The content addressable memory device includes a plurality of match-lines. The content addressable memory device includes a plurality of memory cells electrically coupled in parallel circuit to one match-line of the plurality of match-lines. Each memory cell is configured to store one bit of the data word. The content addressable memory device includes a first memory element in each memory cell. The first memory element is configured to store a low resistance state if the ternary data value of its corresponding bit is low and a high resistance state if the ternary data value of its corresponding bit is either high or don't care. The high resistance state is at least one order of magnitude higher in resistance than the low resistance state. The content addressable memory device also includes a second memory element in each memory cell. The second memory element is configured to store the low resistance state if the ternary data value of its corresponding bit is high and the high resistance state if the ternary data value of its corresponding bit is either low or don't care. The first memory element and the second memory element are electrically coupled to the match-line in parallel circuit.

Yet another aspect of the invention is a method for operating a content addressable memory device. The method includes receiving a data word for storage in the content addressable memory device; each data bit of a data word is set to one of three values of low, high, and don't care. For each data bit in the data word, the method includes programming a first memory element in a memory cell corresponding to the data bit to a low resistance state if a value of the data bit is low and to a high resistance state if the value of the data bit is either high or don't care. The high resistance state is at least one order of magnitude higher in resistance than the low resistance state. For each data bit in the data word, the method also includes programming a second memory element in the memory cell corresponding to the data bit to the low resistance state if the value is high and to the high resistance state if the value of the data bit is either low or don't care.

A further aspect of the invention is a computer program product embodied in a computer usable memory. The computer readable program codes are coupled to the computer usable medium for operating a content addressable memory device. The computer readable program codes configured to cause the program to: receive a data word for storage in the content addressable memory device, each data bit of a data word being set to one of three values of low, high, and don't care; for each data bit in the data word, program a first memory element in a memory cell corresponding to the data bit to a low resistance state if a value of the data bit is low and to a high resistance state if the value of the data bit is either high or don't care, the high resistance state being at least one order of magnitude higher in resistance than the low resistance state; and for each data bit in the data word, program a second memory element in the memory cell corresponding to the data bit to the low resistance state if the value is high and to the high resistance state if the value of the data bit is either low or don't care.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The present invention is described with reference to embodiments of the invention. Throughout the description of the invention reference is made to FIGS. 1-5.

As described in detail below, an embodiment of the current invention is a content addressable memory device for storing ternary data words. Each data bit in a data word is settable to one of three ternary data values of low, high, and don't care. The content addressable memory device is comprised of a plurality of memory cells. Each individual memory cell includes a first memory element and a second memory element. The first and second memory elements of each individual memory cell are electrically coupled to a match-line in parallel circuit.

In a particular configuration of the invention, the first and second memory elements are phase change elements comprised of a phase change material, such as Germanium-Antimony-Tellurium (GST). The memory elements may be programmed to one of two states: a crystalline state or an amorphous state. In the crystalline state (SET), the memory elements exhibit relatively low resistances and require less current to be programmed to. On the other hand, in the amorphous state (RESET), the memory elements have relatively high resistances and require more current to be programmed to. The resistance states of the first and second memory elements are used to store a data bit in a data word. For example, to store a data bit with a low ternary data value, the first memory element is programmed to the low resistance state and the second memory element is programmed to the high resistance state.

Figure 1:
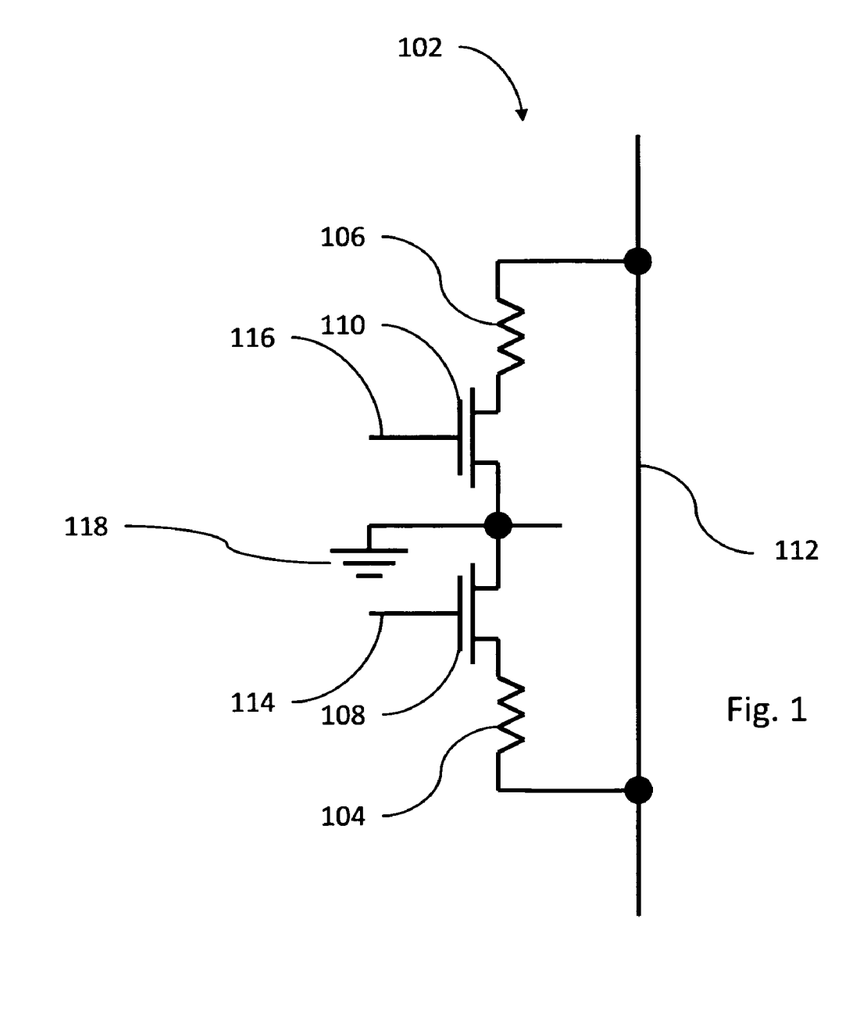
FIG. 1 illustrates a circuit diagram of a content addressable memory cell.

In FIG. 1, an embodiment of a memory cell 102 in accordance with one embodiment of the present invention is illustrated. The memory cell 102 includes a first memory element 104 and a second memory element 106. The first memory element 104 and the second memory element 106 are electrically coupled in parallel circuit to a bit-line 112. The metal line 112 also functions as a match line during the search operation. The first memory element 104 and the second memory element 106 may be comprised of, but not limited to, phase change memory elements, resistive memory elements, floating gate field effect transistors (floating gate FET), Magnetoresistive Random Access Memory (MRAM), or charge trapping devices.

The memory cell 102 includes a first access device 108 electrically coupled to the first memory element 104, a first metal line 114, and a common ground 118. The memory cell 102 also includes a second access device 110 electrically coupled to the second memory element 106, a second metal line 116, and the common ground 118. The first access device 108 and the second access device 110 may be comprised of, but not limited to, field effect transistors (FET), or bipolar junction transistors (BJT).

In one configuration of the invention, the access devices 108 and 110 include source, drain and common terminals. The source terminals of the access devices 108 and 110 are electrically coupled together and to the common ground. The drain terminal of the first access device 108 is electrically coupled to the first memory element 104. The drain terminal of the second access device 110 is electrically coupled to the second memory element 106. The gate terminal of the first access device 108 is electrically coupled to the metal line 114, which functions as the word line during the data storage operation. During the search operation, the metal line 114 also functions as the complementary search line. The gate terminal of the second access device 106 is electrically coupled to the metal line 116, which functions as the complementary word line during the data storage operation. During the search operation, the line 116 also functions as the search line.

Figure 2:
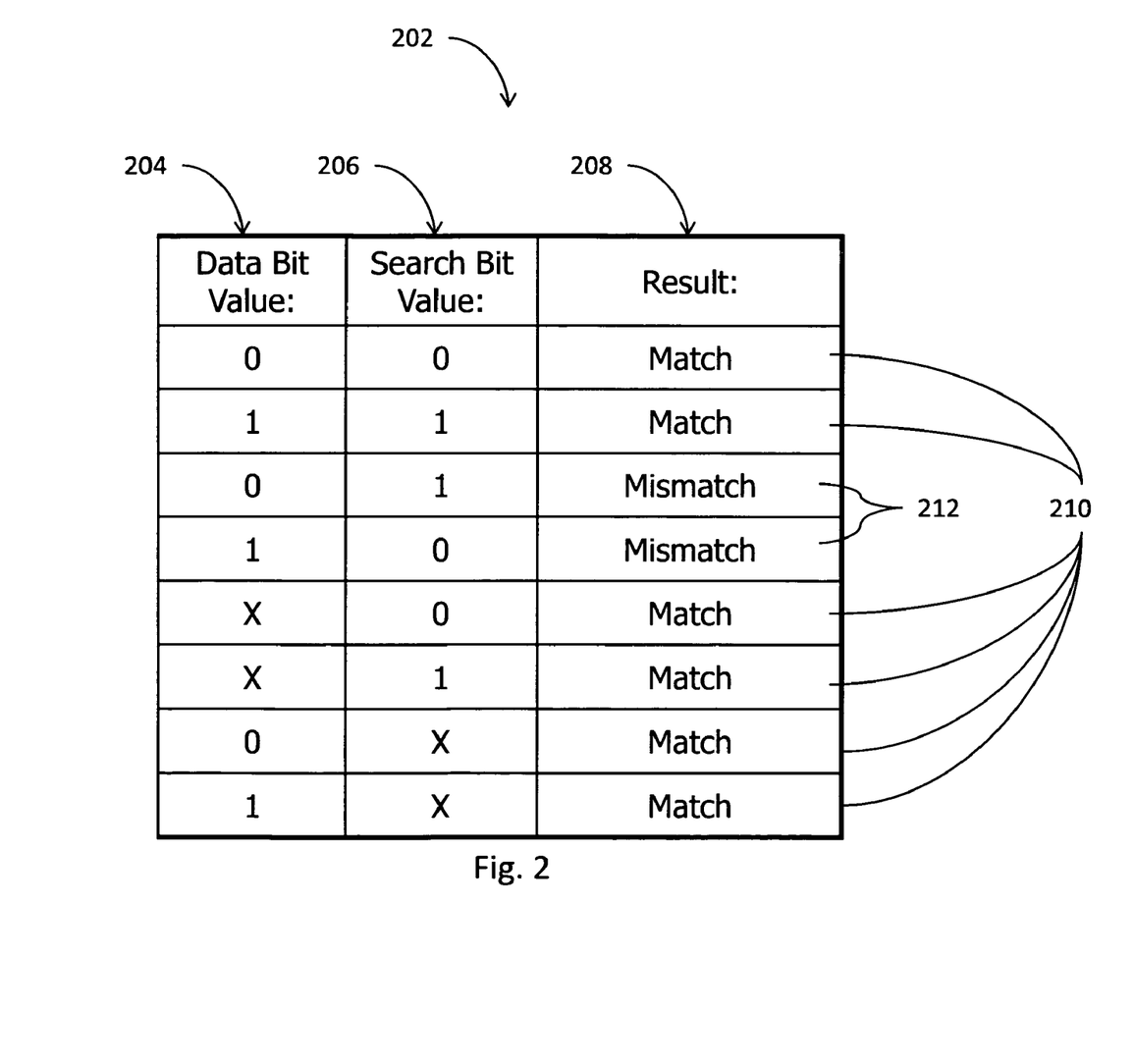
FIG. 2 illustrates a table for search bit and stored bit matching.

Now turning to FIG. 2, a table 202 illustrating match results 208 between a data bit value 204 stored in a memory cell and a search bit value 206 is shown. As illustrated, the stored data bit values 204 can be one of three data values, a "0", a "1", and a "don't care" value (illustrated with a "X"). The search bit values 206 can be one of three data values, a "0", a "1" and a "don't care" value (illustrated with a "X"). The table 202 shows that a match 210 occurs whenever the data bit value 204 and the search bit values 206 are equal or whenever the stored data bit value 204 or the search bit value 206 is a "don't care". Also shown is a mismatch 212 when the search bit value 206 is a "1" and the data bit value 204 is a "0", and when the search bit value 206 is a "0" and the data bit value 204 is a "1". In one embodiment of the invention, the data bit value 204 represents a "0" when it is low and the data bit value 204 represents a "1" when it is high. In an alternate embodiment of the invention, the data bit value 204 represents a "1" when it is low and the data bit value 204 represents a "0" when it is high.

Figure 3A:
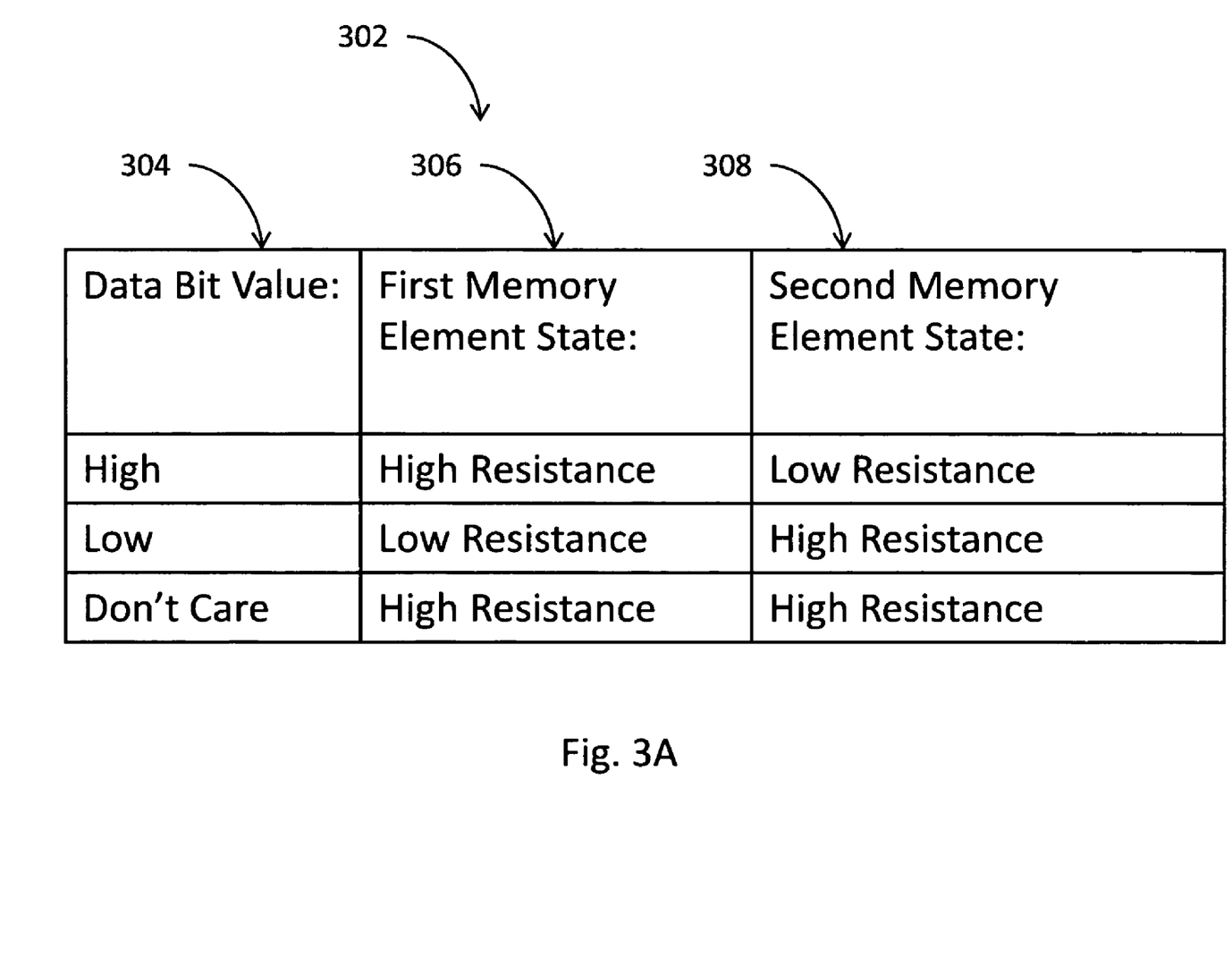
FIG. 3A illustrates a table for stored bit memory element resistance states.

FIG. 3A illustrates a table 302 of memory element storage states for an embodiment of the invention. The table 302 includes data bit values 304, a corresponding state 306 for the first memory element, and a corresponding state 308 for the second memory element. As shown, when the data bit value 304 is high, first memory element is set to a high resistance state 306 (i.e., to the amorphous state for phase change memory) and the second memory element is set to a low resistance state 308 (i.e., to the crystalline state for phase change memory). When the data bit value 304 is low, the first memory element is set to the low resistance state 306 and the second memory element is set to the high resistance state 308. When the data bit value 304 is don't care, the first memory element is set to the high resistance state 306 and the second memory element is also set to the high resistance state 308. In one embodiment of the invention, the high resistance states are at least one order of magnitude higher in resistance than the low resistance state.

Turning back to FIG. 1, we now illustrate an embodiment of a method to store a single bit of information in the memory cell using phase change devices.

The data storage operation consists of two steps. To begin with, both the access devices 108 and 110 are in the off state, as the Word Line 114 and complementary Word Line 116 are biased at zero volts. In the first step, access device 108 is turned on by applying a voltage pulse at the Word Line 114. If the data bit value to be stored is the low state or don't care state, a RESET current pulse is applied to the Bit-line 112 such that the magnitude of current passing through the first memory element 104 is high enough to melt a critical volume of the chalcogenide alloy. This applied pulse is quickly turned off, to convert the molten volume to the amorphous phase, programming the memory element 104 to a high resistance state. If the data bit value to be stored is the high state, a SET current pulse is applied to the Bit-line 112 such that the magnitude of current passing through the first memory element 104 anneals any amorphous region to the poly-crystalline phase of the material, programming the memory element 104 to a low resistance state. During this stage, no current passes through the memory element 106 as the access device 110 is turned off.

In the second step, access device 110 is turned on by applying a voltage pulse at the Word Line 116. If the data bit value to be stored is the high state or don't care state, a RESET current pulse is applied to the Bit-line 112 such that the magnitude of current passing through the second memory element 106 is high enough to melt a critical volume of the chalcogenide alloy. This applied pulse is quickly turned off, to convert the molten volume to the amorphous phase, programming the memory element 106 to a high resistance state. If the data bit value to be stored is the low state, a SET current pulse is applied to the Bit-line 112 such that the magnitude of current passing through the second memory element 106 anneals any amorphous region to the poly-crystalline phase of the material, programming the memory element 106 to a low resistance state. During this stage, no current passes through the memory element 104 as the access device 108 is turned off.

Figure 3B:
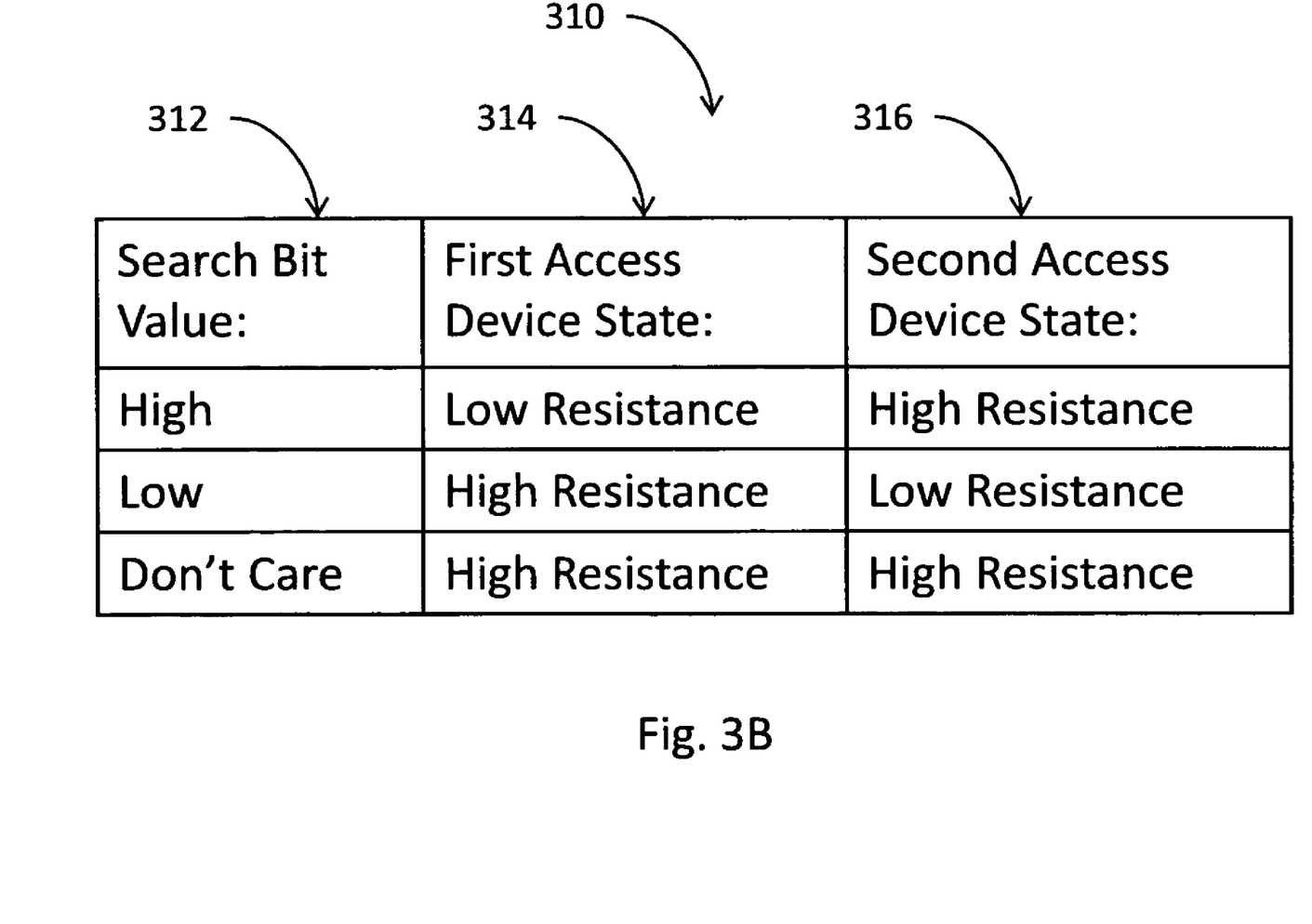
FIG. 3B illustrates a table for search bit access device resistance states.

FIG. 3B illustrates a table 310 of access device search states during the search operation. The table 310 includes search bit values 312, a corresponding state 314 for the first access device (item 108 in FIG. 1), and a corresponding state 316 for the second access device (item 110 in FIG. 1). As shown, when searching for a high search bit value 312 in a specific memory cell, the first access device in the memory cell is set to a low resistance state 314 and the second access device in the memory cell is set to a high resistance state 316. When searching for a low search bit value 312 in a specific memory cell, the first access device in the memory cell is set to a high resistance state 314 and the second access device in the memory cell is set to a low resistance state 316. When searching for a "don't care" search bit value 312 in a specific memory cell, the first access device in the memory cell is set to a high resistance state 314 and the second access device in the memory cell is set to a high resistance state 316. In one embodiment of the invention, the high resistance states are at least one order of magnitude higher in resistance than the low resistance state.

Turning back to FIG. 1, we now illustrate an embodiment of a method to search for a single bit of information in the memory cell in accordance with FIG. 3B and again using phase change devices.

If the search bit value is high, the first access device 108 is set to a low resistance by applying a positive voltage to the complementary search line 114 and the second access device 110 is set to a high resistance by applying zero bias to the search line 116.

If the search bit value is low, the first access device 108 is set to a high resistance by applying zero bias to the complementary search line 114 and the second access device 110 is set to a low resistance by applying a positive voltage to the search line 116.

If the search bit value is "don't care", both the first access device 108 and the second access device 110 is set to a high resistance by applying zero bias to the complementary search line 114 and the search line 116.

The search operation is then conducted by applying a small positive bias voltage at the search line 112, and measuring the resulting current that flows from the search line 112 to the ground 118. It is noted that an appreciably large current (larger than a predetermined baseline current) will pass through the match-line 112 to ground 118 only if either both the first access device 108 and the first memory element 104 are in low resistance states, or both the second access device 110 and the second memory element 106 are in low resistance states. Such conditions indicate a mismatch between the stored bit and the search bit. During a perfect match between the stored data and the search data, no appreciable current can flow from the search line 112 to the ground 118, as the access device connected to the low resistance memory element will be in the off state and the memory element connected to the access device in the low resistance state will be in the high resistance state. Moreover, if both the first and second memory elements 106 and 108 are in high resistance states, an appreciably large current can never flow, indicating that a mismatch condition can never occur. Thus, programming the first and second memory elements 106 and 108 in the high resistance states assigns a don't care value to the memory cell.

Figure 4:
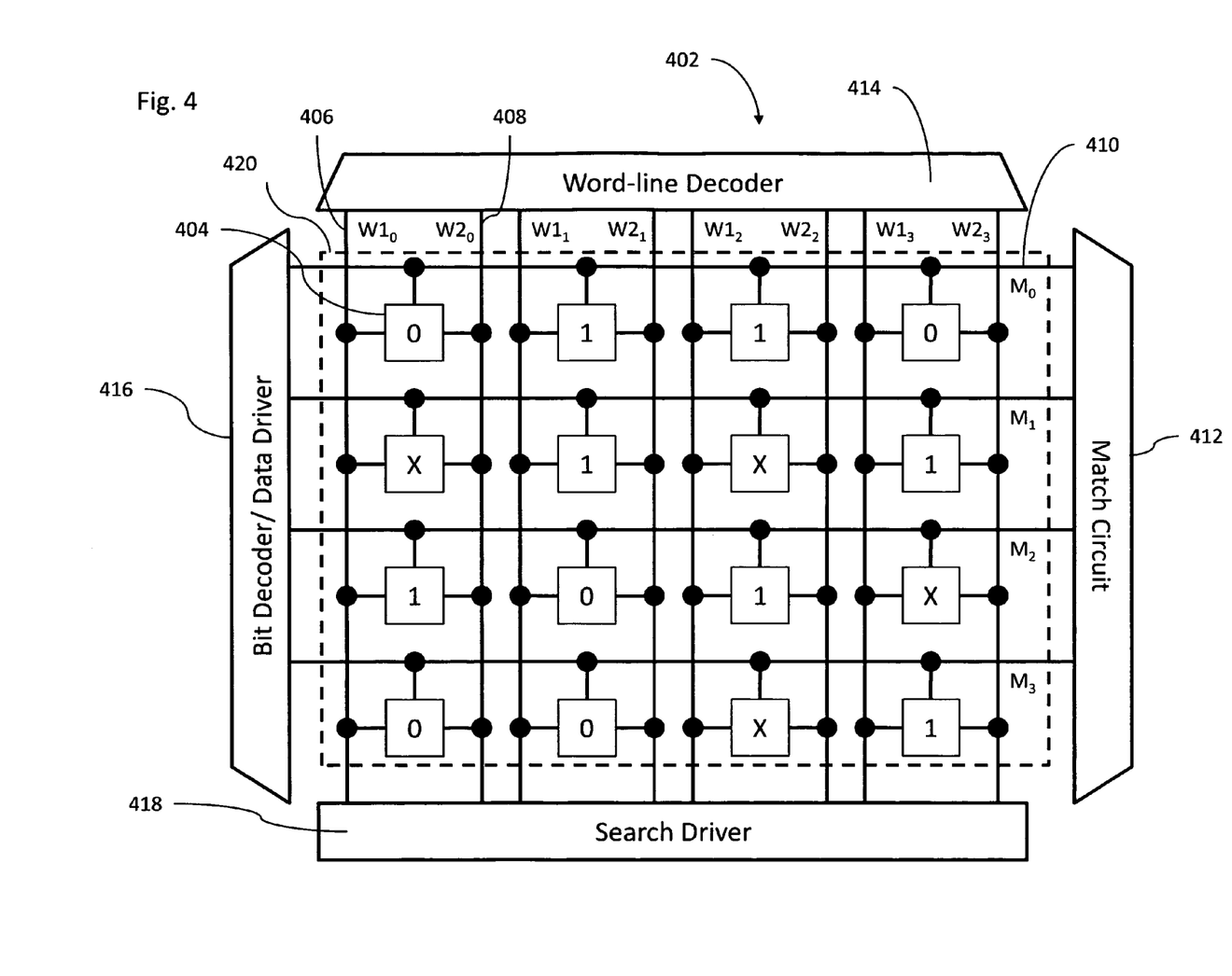
FIG. 4 illustrates an exemplary content addressable memory device.

Now turning to FIG. 4, a content addressable memory device 402 in accordance with an embodiment of the present invention is shown. The content addressable memory device 402 includes a plurality of memory cells 404 arranged in a content addressable memory array 420, a plurality of word-lines 406, a plurality of complementary word-lines 408, a plurality of match-lines 410, and a match circuit 412. In one embodiment of the invention, the content addressable memory device also includes a word-line decoder 414, a bit decoder/data driver 416, and a search driver 418. Those skilled in the art will appreciate that under this configuration, the word-lines 406 function also as the complementary search lines during the search operation, complementary word-lines 408 function also as the search-lines and that the match-lines 410 function also as the bit-lines.

Each data word in the memory array 420 is comprised of a plurality of memory cells electrically coupled in parallel circuit to an individual match-line 410. Each bit of a data word is set to one of three ternary data values of low, high, and don't care. The low and high data values can store "0" and "1" or "1" and "0" respectively. The don't care value is represent by "X" in the figure. As shown, each individual memory cell 404 is electrically coupled to an individual first word-line 406, an individual second word-line 408, and an individual match-line 410.

The word-lines 406 and the complementary word-lines 408 are electrically coupled to the word-lines decoder 414 and the search driver 418. In one embodiment of the invention, the word-line decoder/data driver 414 applies voltage biases to the word-lines 406 and the complementary word-lines 408 to select the memory cell during storage operations, while the search driver 418 applies the bias voltages to the complementary search-lines 406 and the search-lines 408 during search operations. The bit decoder/data driver provides a RESET current pulse or a SET current pulse to the two memory elements in the individual memory cell 404 based on the resistance states that they need to be programmed to. The search driver provides the bias voltages to the individual complementary search-lines 406 and the search-lines 408 based on the resistance values that need to be searched in the memory cell 404.

The plurality of match-lines 410 are electrically coupled to the bit decoder/data driver 416, and the match circuit 412. In one embodiment of the invention the match circuit 412 applies a positive voltage to the plurality of match-lines 410 during search operations. As described above, during search operations, a match is indicated between a data word and a search word by the match circuit 412 if an individual match-line 410 has a collective current below a threshold value. In an alternate embodiment of the invention, a match is indicated between a data word and search word by the match circuit 412 if an individual match-line 410 has a collective resistance above a threshold value. If any number of memory cells of the plurality of memory cells 404 electrically coupled in series to an individual match-line 410 has a mismatch, a match is not indicated. If a match between the data word and search word is determined, a word location (the address of the specific matching match-line) is outputted.

In a particular embodiment of the invention, fuzzy matching is used in determining the number of mismatches in an individual match-line 410. For example, in accordance with the figure, the data word stored in match-line $M_0$ is "0110". If the search word is "1111", relatively large current would flow to the match-line 410 at the memory cell 404 storing the first data bit and the memory cell storing the fourth data bit. Since the memory cells 404 are electrically couple to the match-line 410 in parallel, the collective current measured by the match circuit 412 would have the combined current of two mismatch memory cells 404. The quantity of current flow along $M_0$ allows the match circuit 412 to determine that match-line $M_0$ contains two mismatches. Thus, the match circuit 412 is configured to determine a number of mismatched bits between the data word and a search word based on the collective current through an individual match-line. The number of mismatched bits is proportional to the collective current through the individual match-line.

In an alternate embodiment of the invention, the match circuit 412 determines the number of mismatched bits between the data word and a search word based on the collective resistance of an individual match-line 410. The number of mismatched bits is inversely proportional to the collective resistance.

Figure 5A:
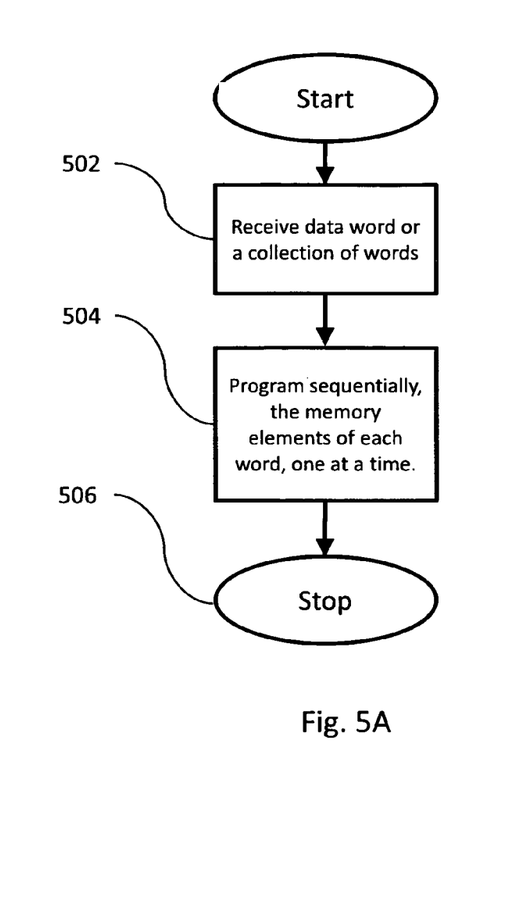
FIG. 5A illustrates a method for storing data words.

FIG. 5A illustrates an embodiment of a method for ternary data word storage in the content addressable memory device. Each data bit of the data word is set to one of three values of low, high, and don't care. The process flow begins at receiving operation 502. During receiving operation 502, the bit decoder/data drive receives a data word or a collection of data words. The data word contains a string of ternary data bit values. Each data bit value is set to one of three values of low, high, and don't care. Each data bit value is stored at a corresponding memory cell on an individual match-line. After receiving operation 502 is completed, control passes to programming operation 504.

During programming operation 504, the word-line driver applies bias voltages to the word-lines 406 and the complementary word-lines 408 sequentially, so as to select the access devices within each memory cell, one at a time. During each step, the bit decoder/data driver provides the RESET or the SET current pulse to the Bit-lines 410, so as to sequentially program the two memory elements within each memory cell to either the low resistance state or the high resistance state. As stated above, the resistance state programmed to the two memory elements is based on the data bit value to be stored in each memory cell. The method ends after program operation 506.

Figure 5B:
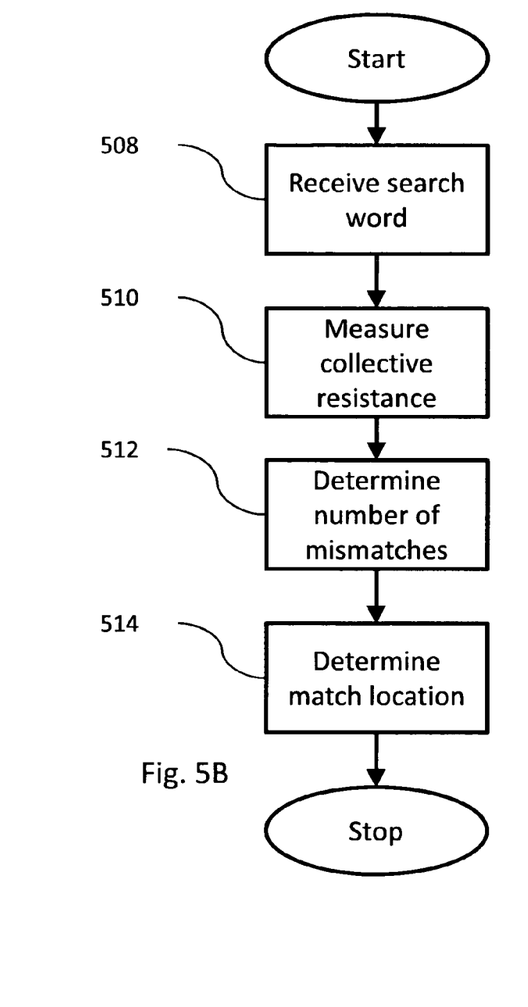
FIG. 5B illustrates a method for matching search words and data words.

FIG. 5B illustrates a method for search operations for the content addressable memory device contemplated by an embodiment of the present invention. Process flow begins at receiving operation 508. During receiving operation 508, the search driver receives a search word. The search word contains a string of ternary data values to be searched for in the content addressable memory device. After receiving operation 508 completes, control passes to measuring operation 510.

During measuring operation 510, the collective resistance of each individual match-line of the plurality of match-lines in the content addressable memory device is measured in parallel. As stated above, the collective resistance of individual match-lines is the additive resistance of every memory cell electrically coupled to the specified match-line. In one embodiment of the invention, the match circuit is utilized to measure the collective resistance of each individual match-line. In another embodiment of the invention, the collective current flowing through each individual match-line is measured by the match circuit by applying a positive bias to each match line. After measuring operation 510, control passes to determining operation 512.

During determining operation 512 the number of mismatches in a specific match-line is determined. As stated above, the number of mismatches between the search word and the data word is determined based on the collective resistance of the specified match-line. The number of mismatched bits is inversely proportional to the collective resistance. In an alternate embodiment of the invention, the number of mismatches between the search word and the data word is determined based on the collective current of the specified match-line. The number of mismatched bits is proportional to the collective current. If there are no mismatches, that is, the collective resistance is above a threshold value or the collective current is below a threshold value, control passes to determining operation 514.

During determining operation 514, the location of the specific match-line containing the data word that matches the search word is determined and the result is outputted. As mentioned above, fuzzy matching may be employed in one embodiment of the invention. In this embodiment, the memory address of the stored data word closest to the search word is output. In another embodiment, the memory address of each stored word, and the corresponding number of positions of mismatch bits between the search word and each stored word is output. An output bit may also be activated to indicate no exact match to the search word was found. After determining operation 514, the process ends.

Those skilled in art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, performing arithmetic operations, and the like.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, a DVD, or any other form of storage medium known in the art. A storage medium is coupled to the processor such that the processor can read information from, and write information to, the storage medium. In the alternative, the storage medium may be integral to the processor. The processor and the storage medium can reside in an ASIC. The ASIC can reside in a user terminal. In the alternative, the processor and the storage medium can reside as discrete components in a user terminal.

The modules can include, but are not limited to, any of the following: software or hardware components such as software object-oriented software components, class components and task components, processes, methods, functions, attributes, procedures, subroutines, segments of program code, drivers, firmware, microcode, circuitry, data, databases, data structures, tables, arrays, or variables.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

What is claimed is:

1. A content addressable memory device for storing data words, each bit of a data word being set to one of three ternary data values of low, high, and don't care, the content addressable memory device comprising:
   a plurality of match-lines;
   a plurality of memory cells electrically coupled in parallel circuit to one match-line of the plurality of match-lines, each memory cell storing one bit of the data word;
   a first memory element in each memory cell configured to store a low resistance state if the ternary data value of its corresponding bit is low and a high resistance state if the ternary data value of its corresponding bit is either high or don't care, the high resistance state being at least one order of magnitude higher in resistance than the low resistance state;
   a second memory element in each memory cell configured to store the low resistance state if the ternary data value of its corresponding bit is high and the high resistance state if the ternary data value of its corresponding bit is either low or don't care, the match-line electrically coupling the first memory element and the second memory element in a parallel circuit; and
   a match circuit electrically coupled to each match-line, the match circuit configured to measure a collective effective resistance of the plurality of memory cells electrically coupled to each individual match-line during a search operation; and
   wherein the match circuit is configured to determine a number of mismatched bits between the data word and a search word based on the collective effective resistance of an individual match-line, the number of mismatched bits being inversely proportional to the collective effective resistance.

2. The content addressable memory device of claim 1, wherein the first and second memory elements in each memory cell are comprised of memory elements selected from a group consisting of phase change elements, resistive memory elements, floating gate field effect transistors (floating gate FET), Magnetoresistive Random Access Memory (MRAM), and charge trapping devices.

3. The content addressable memory device of claim 1, further comprising a match circuit electrically coupled to each match-line, the match circuit configured to measure a collective current through the plurality of memory cells electrically coupled to each individual match-line during a search operation.

4. The content addressable memory device of claim 3, wherein the match circuit is configured to indicate a match if the collective current through an individual match-line is below a current threshold value.

5. The content addressable memory device of claim 3, wherein the match circuit is configured to determine a number of mismatched bits between the data word and a search word based on the collective current through an individual match-line, the number of mismatched bits being proportional to the collective current through the individual match-line.

6. The content addressable memory device of claim 1, wherein the match circuit is configured to indicate a match if the collective effective resistance of an individual match-line is above a resistance threshold value.

7. The content addressable memory device of claim 1, further comprising:
 a first access device in each memory cell electrically coupled to the first memory element in the memory cell; and
 a second access device in each memory cell electrically coupled to the second memory element in the memory cell.

8. The content addressable memory device of claim 7, wherein the first and second access devices are comprised of access devices selected from a group consisting of field effect transistors (FET) and bipolar junction transistors (BJT).

9. The content addressable memory device of claim 7, further comprising:
 wherein the first access device is biased to a low resistance state if the value of a corresponding search bit in a search word is high and to a high resistance state if the value of the corresponding search bit is low or a don't care state, the high resistance state being at least one order of magnitude higher than the low resistance state; and
 wherein the second access device is biased to the high resistance state if the value of a corresponding bit in a search word is high or a don't care state and to the low resistance state if the value of the corresponding search bit is low.

10. The content addressable memory device of claim 7, further comprising:
 wherein the first access device includes a first source terminal; and
 wherein the second access device includes a second source terminal, the second source terminal being electrically coupled to the first source terminal and a common ground.

11. A method for operating a content addressable memory device comprising:
 receiving a data word for storage in the content addressable memory device, each data bit of a data word being set to one of three values of low, high, and don't care;
 for each data bit in the data word, programming a first memory element in a memory cell corresponding to the data bit to a low resistance state if a value of the data bit is low and to a high resistance state if the value of the data bit is either high or don't care, the high resistance state being at least one order of magnitude higher in resistance than the low resistance state; and
 for each data bit in the data word, programming a second memory element in the memory cell corresponding to the data bit to the low resistance state if the value is high and to the high resistance state if the value of the data bit is either low or don't care;
 receiving a search word for search through data words stored in the content addressable memory device;
 for each search bit in the search word, biasing a first access device electrically coupled to the first memory element to the low resistance state if the value of search bit is high and to the high resistance state if the value of search bit is low or a don't care state;
 for each search bit in the search word, biasing a second access device electrically coupled to the second memory element to the high resistance state if the value of search bit is high or a don't care state and to the low resistance state if the value of search bit is low;
 measuring a collective effective resistance of each data word stored in the content addressable memory device; and
 outputting a memory location of an individual data word if the collective effective resistance of the individual data word is above a threshold value.

12. A method for operating a content addressable memory device comprising:
 receiving a data word for storage in the content addressable memory device, each data bit of a data word being set to one of three values of low, high, and don't care;
 for each data bit in the data word, programming a first memory element in a memory cell corresponding to the data bit to a low resistance state if a value of the data bit is low and to a high resistance state if the value of the data bit is either high or don't care, the high resistance state being at least one order of magnitude higher in resistance than the low resistance state; and
 for each data bit in the data word, programming a second memory element in the memory cell corresponding to the data bit to the low resistance state if the value is high and to the high resistance state if the value of the data bit is either low or don't care;
 receiving a search word for search through data words stored in the content addressable memory device;
 for each search bit in the search word, biasing a first access device electrically coupled to the first memory element to the low resistance state if the value of search bit is high and to the high resistance state if the value of search bit is low or a don't care state;
 for each search bit in the search word, biasing a second access device electrically coupled to the second memory element to the high resistance state if the value of search bit is high or a don't care state and to the low resistance state if the value of search bit is low;
 measuring a collective current of each data word stored in the content addressable memory device; and
 outputting a memory location of an individual data word if the collective current of the individual data word is below a threshold value.

13. A computer program product embodied in a computer usable memory comprising:
  computer readable program codes coupled to the computer usable medium for operating a content addressable memory device, the computer readable program codes configured to cause the program to:
  receive a data word for storage in the content addressable memory device, each data bit of a data word being set to one of three values of low, high, and don't care;
  for each data bit in the data word, program a first memory element in a memory cell corresponding to the data bit to a low resistance state if a value of the data bit is low and to a high resistance state if the value of the data bit is either high or don't care, the high resistance state being at least one order of magnitude higher in resistance than the low resistance state; and
  for each data bit in the data word, program a second memory element in the memory cell corresponding to the data bit to the low resistance state if the value is high and to the high resistance state if the value of the data bit is either low or don't care;
  receive a search word for search through data words stored in the content addressable memory device;
  for each search bit in the search word, bias a first access device electrically coupled to the first memory element to the low resistance state if the value of search bit is high and to the high resistance state if the value of search bit is low or a don't care state;
  for each search bit in the search word, bias a second access device electrically coupled to the second memory element to the high resistance state if the value of search bit is high or a don't care state and to the low resistance state if the value of search bit is low;
  measure a collective effective resistance of each data word stored in the content addressable memory device; and
  output a memory location of an individual data word if the collective effective resistance of the individual data word is above a threshold value.

\* \* \* \* \*